United States Patent
Nguyen et al.

(10) Patent No.: US 10,829,855 B2
(45) Date of Patent: *Nov. 10, 2020

(54) GAS DISTRIBUTION SHOWERHEAD FOR SEMICONDUCTOR PROCESSING

(71) Applicant: Applied Materials, Inc., Santa Clara, CA (US)

(72) Inventors: Anh N. Nguyen, Milpitas, CA (US); Dmitry Lubomirsky, Cupertino, CA (US); Mehmet Tugrul Samir, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 15/492,938

(22) Filed: Apr. 20, 2017

(65) Prior Publication Data
US 2017/0335457 A1 Nov. 23, 2017

Related U.S. Application Data

(60) Provisional application No. 62/339,200, filed on May 20, 2016.

(51) Int. Cl.
*C23C 16/455* (2006.01)

(52) U.S. Cl.
CPC .... *C23C 16/45582* (2013.01); *C23C 16/4558* (2013.01); *C23C 16/45508* (2013.01);
(Continued)

(58) Field of Classification Search
CPC ........ C23C 16/45565; C23C 16/45574; C23C 16/45512; C23C 16/45561;
(Continued)

(56) References Cited

U.S. PATENT DOCUMENTS

2001/0035127 A1\* 11/2001 Metzner ................ C23C 16/407
118/715
2002/0000196 A1 1/2002 Park
(Continued)

FOREIGN PATENT DOCUMENTS

JP       2002-053965 A       2/2002
JP       2002252219 A  \*    9/2002  ....... C23C 16/45565
(Continued)

OTHER PUBLICATIONS

European Patent Office, English computer translation of JP2002252219. (Year: 2020).\*
(Continued)

*Primary Examiner* — Matthew J Song
(74) *Attorney, Agent, or Firm* — Patterson + Sheridan, LLP

(57) ABSTRACT

Embodiments disclosed herein generally relate to a gas distribution assembly for providing improved uniform distribution of processing gases into a semiconductor processing chamber. The gas distribution assembly includes a gas distribution plate, a blocker plate, and a dual zone showerhead. The gas distribution assembly provides for independent center to edge flow zonality, independent two precursor delivery, two precursor mixing via a mixing manifold, and recursive mass flow distribution in the gas distribution plate.

20 Claims, 5 Drawing Sheets

(52) U.S. Cl.
CPC .. *C23C 16/45512* (2013.01); *C23C 16/45514* (2013.01); *C23C 16/45559* (2013.01); *C23C 16/45561* (2013.01); *C23C 16/45565* (2013.01); *C23C 16/45574* (2013.01); *C23C 16/45587* (2013.01); *C23C 16/45591* (2013.01)

(58) Field of Classification Search
CPC ........ C23C 16/45591; C23C 16/45508; C23C 16/45514; C23C 16/45559; C23C 16/4558

See application file for complete search history.

(56) References Cited

U.S. PATENT DOCUMENTS

| | | | |
|---|---|---|---|
| 2005/0029369 A1* | 2/2005 | Nagaoka | H01L 21/67017 239/558 |
| 2006/0169671 A1* | 8/2006 | Miya | H01J 37/3244 216/67 |
| 2007/0181181 A1* | 8/2007 | Mizusawa | C23C 16/45565 137/1 |
| 2008/0088097 A1* | 4/2008 | Tanaka | C23C 16/4409 277/650 |
| 2008/0206483 A1 | 8/2008 | Paterson et al. | |
| 2008/0236495 A1 | 10/2008 | Tompa | |
| 2009/0159213 A1 | 6/2009 | Bera et al. | |
| 2009/0162260 A1 | 6/2009 | Bera et al. | |
| 2010/0136216 A1 | 6/2010 | Tsuei et al. | |
| 2011/0155049 A1* | 6/2011 | Solomon | C30B 25/08 117/99 |
| 2013/0149867 A1* | 6/2013 | Masuda | H01J 37/3244 438/695 |
| 2013/0263944 A1* | 10/2013 | Gungor | F17D 3/00 137/507 |
| 2014/0090599 A1 | 4/2014 | Saitou | |
| 2016/0362785 A1* | 12/2016 | Kim | C23C 16/45512 |
| 2017/0335456 A1* | 11/2017 | Nguyen | C23C 16/45582 |

FOREIGN PATENT DOCUMENTS

| | | |
|---|---|---|
| JP | 2008-047687 A | 2/2008 |
| JP | 2009-088232 A | 4/2009 |
| JP | 2009-194125 A | 8/2009 |
| JP | 2015-138885 A | 7/2015 |
| KR | 20020000588 A | 1/2002 |
| KR | 10-0697158 | 3/2007 |
| KR | 100697158 B1 | 3/2007 |
| KR | 2010-0131566 A | 12/2010 |
| KR | 20150055822 A | 5/2015 |
| KR | 20150113620 A | 10/2015 |
| WO | 2008/016023 A1 | 2/2008 |
| WO | 2008/117675 A1 | 10/2008 |

OTHER PUBLICATIONS

International Search Report and Written Opinion in related application PCT/US2017/028641 dated Jul. 28, 2017.
Office Action from Korean Patent Application No. 10-2018-7037145 dated Mar. 12, 2020, with concise statement of relevance.
Office Action from Korean Patent Application No. 10-2018-7037091 dated Mar. 12, 2020, with concise statement of relevance.
JP Office Action dated Aug. 4, 2020 for Application No. 2019-010303.
CN Office Action dated Jul. 17, 2020 for Application No. 201811492381.4.

* cited by examiner

GAS DISTRIBUTION SHOWERHEAD FOR SEMICONDUCTOR PROCESSING

CROSS-REFERENCE TO RELATED APPLICATIONS

This application claims benefit of U.S. provisional patent application Ser. No. 62/339,200, filed May 20, 2016, which is hereby incorporated herein by reference.

BACKGROUND

Field of the Disclosure

Embodiments of the present disclosure generally relate to a system and apparatus for processing semiconductor substrates. More specifically, embodiments of the present disclosure relate to a gas distribution assembly having a dual zone showerhead for improving deposition uniformity on large area substrates.

Description of the Related Art

A gas distribution showerhead is disposed in a semiconductor processing chamber, and typically overlies the workpiece or substrate. As demand for electronic devices, such as flat panel displays and integrated circuits, continues to increase, so must the size of the substrates and chambers for processing the substrates. Displays and integrated circuits are commonly fabricated by a series of processes in which layers are deposited on a substrate and the deposited material is etched into desired patterns. The processes commonly include chemical vapor deposition (CVD).

Furthermore, as substrate sizes continue to increase, the uniformity of the films deposited on the substrate becomes increasingly difficult. Therefore, there is a need in the art for a process chamber that enables improved substrate process uniformity. Specifically, there is a need for an improved gas distribution assembly which provides for improved uniform distribution of process gases in a semiconductor processing chamber.

SUMMARY

Embodiments disclosed herein generally relate to a gas distribution assembly for providing improved uniform distribution of processing gases into a semiconductor processing chamber. The gas distribution assembly includes a gas distribution plate, a blocker plate, and a dual zone showerhead. The gas distribution assembly provides for independent center to edge flow zonality, independent two precursor delivery, two precursor mixing via a mixing manifold, and recursive mass flow distribution in the gas distribution plate.

In one embodiment, a gas distribution assembly is disclosed. The gas distribution assembly includes a gas distribution plate, a blocker plate coupled to the gas distribution plate, and a dual zone showerhead coupled to the blocker plate. The gas distribution plate include at least one gas supply inlet, a plurality of channels forming a path splitting manifold operatively connected to the gas supply inlet, and a first plurality of gas holes disposed within the plurality of channels and through the gas distribution plate. The blocker plate includes an inner zone comprising a second plurality of gas holes, an outer zone comprising a third plurality of gas holes, and a first barrier wall separating the inner zone from the outer zone. The dual zone showerhead includes an inner zone comprising a fourth plurality of gas holes, an outer zone comprising a fifth plurality of gas holes, and a trench disposed between the inner zone and the outer zone. The trench is configured to accept the first barrier wall such that the inner zone of the dual zone showerhead is physically separated from the outer zone of the dual zone showerhead. Also, the second plurality of gas holes and the fourth plurality of gas holes are patterned to avoid a co-axial flow, and the third plurality of gas holes and the fifth plurality of gas holes are patterned to avoid a co-axial flow.

In another embodiment, a gas distribution assembly is disclosed. The gas distribution assembly includes a gas distribution plate, a blocker plate coupled to the gas distribution plate, a dual zone showerhead coupled to the blocker plate, and a mixing manifold operatively coupled to the gas distribution plate. The gas distribution plate includes at least one gas supply inlet, a plurality of channels forming a path splitting manifold operatively connected to the gas supply inlet, and a first plurality of gas holes disposed within the plurality of channels and through the gas distribution plate. The blocker plate includes an inner zone comprising a second plurality of gas holes, an outer zone comprising a third plurality of gas holes, and a first barrier wall separating the inner zone from the outer zone. The dual zone showerhead includes an inner zone comprising a fourth plurality of gas holes, an outer zone comprising a fifth plurality of gas holes, and a trench disposed between the inner zone and the outer zone. The trench is configured to accept the first barrier wall such that the inner zone of the dual zone showerhead is physically separated from the outer zone of the dual zone showerhead. The mixing manifold includes a plurality of mixing channels. The mixing channels each include a first portion and a second portion. A diameter of a choke channel disposed between the first portion and the second portion is less than any diameter of the first portion or the second portion.

In another embodiment, a gas distribution assembly is disclosed. The gas distribution assembly includes a mixing manifold coupled to a gas distribution plate, a blocker plate coupled to the gas distribution plate, and a dual zone showerhead coupled to the blocker plate. The mixing manifold includes a plurality of mixing channels. The mixing channels include a first portion and a second portion, wherein a diameter of a choke channel disposed between the first portion and the second portion is less than any diameter of the first portion or the second portion. The gas distribution plate includes at least one gas supply inlet, a plurality of channels forming a path splitting manifold operatively connected to the gas supply inlet, and a first plurality of gas holes disposed within the plurality of channels and through the gas distribution plate. The blocker plate includes an inner zone comprising a second plurality of gas holes, an outer zone comprising a third plurality of gas holes, and a first barrier wall separating the inner zone from the outer zone. The dual zone showerhead includes an inner zone comprising a fourth plurality of gas holes, an outer zone comprising a fifth plurality of gas holes, and a trench disposed between the inner zone and the outer zone. The trench is configured to accept the first barrier wall such that the inner zone of the dual zone showerhead is physically separated from the outer zone of the dual zone showerhead. The second plurality of gas holes and the fourth plurality of gas holes are patterned to avoid a co-axial flow, and wherein the third plurality of gas holes and the fifth plurality of gas holes are patterned to avoid a co-axial flow.

In another embodiment, a processing chamber is disclosed. The processing chamber includes a chamber body at least partially defining a processing volume within the chamber body, a substrate support disposed in the processing volume and coupled with the chamber body, an inlet adapter, and a gas distribution assembly. The gas distribution assembly includes a mixing manifold defining a plurality of mixing channels, a blocker plate, and a dual zone showerhead coupled with the blocker plate. The blocker plate includes an inner zone defining a first plurality of gas holes, an outer zone defining a second plurality of gas holes, and a first barrier wall separating the inner zone from the outer zone. The dual zone showerhead includes an inner zone defining a third plurality of gas holes, an outer zone defining a fourth plurality of gas holes, and a trench disposed between the inner zone and the outer zone. The trench is configured to accept the first barrier wall such that the inner zone of the dual zone showerhead is physically separated from the outer zone of the dual zone showerhead. The first plurality of gas holes and the third plurality of gas holes are patterned to avoid a co-axial flow, and the second plurality of gas holes and the fourth plurality of gas holes are patterned to avoid a co-axial flow.

In another embodiment, a processing chamber is disclosed. The processing chamber includes a chamber body defining a processing volume within the chamber body, a gas distribution plate, a blocker plate coupled to the gas distribution plate, a dual zone showerhead coupled to the blocker plate, and a mixing manifold operatively coupled to the gas distribution plate. The gas distribution plate includes at least one gas supply inlet, and a first plurality of gas holes defined through the gas distribution plate. The blocker plate includes an inner zone comprising a second plurality of gas holes, an outer zone comprising a third plurality of gas holes, and a first barrier wall separating the inner zone from the outer zone. The dual zone showerhead includes an inner zone comprising a fourth plurality of gas holes, an outer zone comprising a fifth plurality of gas holes, and a trench disposed between the inner zone and the outer zone. The trench is configured to accept the first barrier wall such that the inner zone of the dual zone showerhead is physically separated from the outer zone of the dual zone showerhead. The mixing manifold includes a plurality of mixing channels. The mixing channels include a first portion and a second portion, wherein a diameter of a choke channel disposed between the first portion and the second portion is less than any diameter of the first portion or the second portion.

In another embodiment, a processing chamber is disclosed. The processing chamber includes a chamber body defining a processing volume within the chamber body, a substrate support disposed in the processing volume and coupled to the chamber body, a gas supply source coupled to the chamber body, a gas distribution assembly disposed in the chamber body, and a mixing manifold operatively coupled to the gas distribution plate. The gas distribution assembly includes a gas distribution plate, a blocker plate coupled to the gas distribution plate, and a dual zone showerhead coupled to the blocker plate. The gas distribution plate includes at least one gas supply inlet, and a first plurality of gas holes disposed through the gas distribution plate. The blocker plate includes an inner zone comprising a second plurality of gas holes, an outer zone comprising a third plurality of gas holes, and a first barrier wall separating the inner zone from the outer zone. The dual zone showerhead includes an inner zone comprising a fourth plurality of gas holes, an outer zone comprising a fifth plurality of gas holes, and a trench disposed between the inner zone and the outer zone. The trench is configured to accept the first barrier wall such that the inner zone of the dual zone showerhead is physically separated from the outer zone of the dual zone showerhead. The mixing manifold includes a plurality of mixing channels, the mixing channels comprising a first portion and a second portion, wherein a diameter of a choke channel disposed between the first portion and the second portion is less than any diameter of the first portion or the second portion.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a gas distribution assembly for providing improved uniform distribution of processing gases into a semiconductor processing chamber. The gas distribution assembly includes a gas distribution plate, a blocker plate, and a dual zone showerhead. The gas distribution assembly provides for independent center to edge flow zonality, independent two precursor delivery, two precursor mixing via a mixing manifold, and recursive mass flow distribution in the gas distribution plate.

Figure 1:
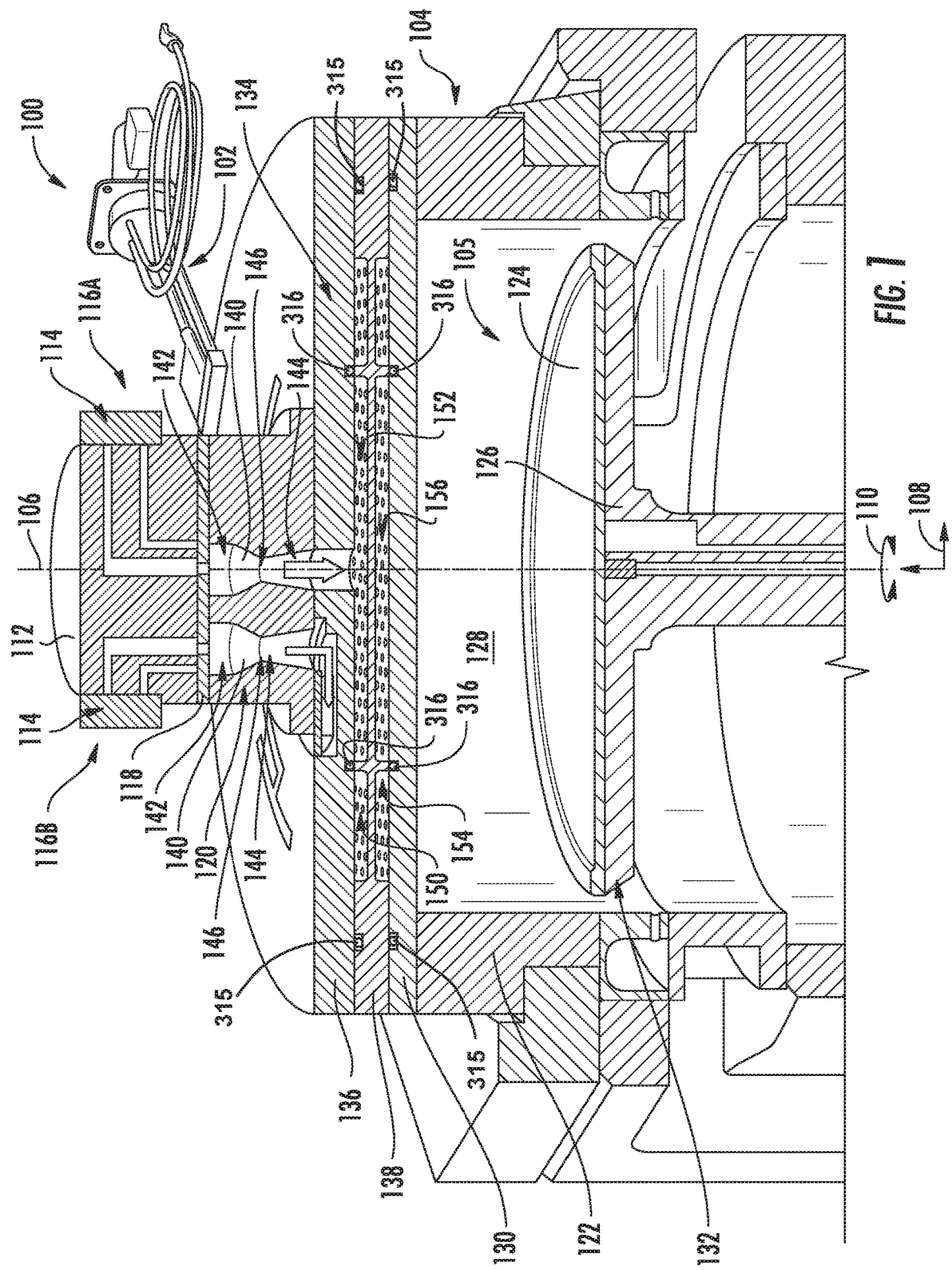
FIG. 1 is a schematic cross-sectional view of a processing chamber, according to one embodiment disclosed herein.

FIG. 1 is a cross-sectional view of a processing system 100. The processing system 100 includes a gas source 102 and a process chamber 104. The process chamber 104 has a processing volume 105 defined therein. In some embodiments, the processing volume is defined by a spacer 122 which surrounds a substrate support 124 for holding a substrate thereon. The substrate may rest on the substrate support 124 across a processing region 128 from a gas distribution showerhead 130. The substrate may enter and exit the process chamber 104 through a slit valve opening 132 disposed through the process chamber 104. In some embodiments, the substrate support 124 is coupled to a pedestal heater 126 for providing heat to the substrate support.

In the orientation of FIG. 1, a general direction of gas and/or product flow is downwards, and this direction may be referred to as "downstream" herein, while an opposing direction upwards in the orientation of FIG. 1, may be referred to as "upstream." Also, significant portions of the apparatus shown in FIG. 1 may be cylindrically symmetric about a central axis 106, with associated directions being defined as a radial direction 108 and an azimuthal direction 110. This convention of directions may be used herein, although one skilled in the art will understand that many of the principles described herein are not limited to cylindrically symmetric systems.

As shown in FIG. 1, the process chamber 104 generally includes an inlet adapter 112 disposed downstream from at least one flow ratio controller 114 coupled to the process chamber 104. In some embodiments, the processing system 100 may include a plurality of flow ratio controllers 114. As shown in FIG. 1, two four-channel flow ratio controllers 114 are coupled to the process chamber 104. The flow ratio controllers 114 may be disposed outside and/or inside the processing region 128. Each flow ratio controller 114 may provide for independent chamber matching. Gas may enter the inlet adapter 112 from the flow ratio controller 114 on a first side 116A of the inlet adapter 112 such that the gas is provided to a first section of a gas distribution assembly. Also, gas may enter the inlet adapter 112 from the flow ratio controller 114 on a second side 116B of inlet adapter such that the gas is also provided to a second section of the gas distribution assembly. Gas entering the flow ratio controller 114 may be HF and/or NH$_3$.

The inlet adapter 112 may be coupled to a mixing plate 118. The mixing plate 118 may be disposed downstream from the inlet adapter 112. The mixing plate 118 may be coupled to a gas distribution assembly 134. The gas distribution assembly 134 may be disposed downstream from the mixing plate 118. In some embodiments, the gas distribution assembly 134 may include a mixing manifold 120, the gas distribution showerhead 130, a gas distribution plate 136, and/or a blocker plate 138, among others. The blocker plate 138 is coupled to the spacer 122 to further define the processing region 128.

The mixing manifold 120 is operatively coupled to the mixing plate 118 at a first end and to the gas distribution plate 136 at a second end. The mixing manifold 120 includes a plurality of mixing channels 140. As shown in FIG. 1, two mixing channels are shown. Each mixing channel 140 includes a first portion 142 and a second portion 144 separated by a choke channel 146. The choke channel 146 is disposed between the first portion 142 and the second portion 144. A diameter of the choke channel 146 is less than a diameter of the first portion 142 and/or the second portion 144. Differences in the diameter of the choke channel 146 and the first portion 142 or the second portion 144 may allow for variable flow rates of a gas.

The gas distribution assembly 134 also includes the gas distribution plate 136. The gas distribution plate 136 is coupled to the mixing manifold 120 and, in some embodiments, is disposed downstream of the mixing manifold 120. In some embodiments, the gas distribution plate 136 comprises an aluminum material, for example, an Al 6061-T6 material. In some embodiments, the gas distribution plate 136 may comprise a ceramic material, a dielectric material, quartz material, or a stainless steel material.

The gas distribution assembly further includes the blocker plate 138. The blocker plate 138 is coupled to the gas distribution plate 136 and, in some embodiments, is disposed downstream of the gas distribution plate 136. In some embodiments, the blocker plate 138 comprises an aluminum material, for example, an Al 6061-T6 material. In some embodiments, the blocker plate 138 may comprise a ceramic material, a dielectric material, quartz material, or a stainless steel material.

The gas distribution assembly further includes the gas distribution showerhead 130. The gas distribution showerhead 130 is coupled to the blocker plate 138 and, in some embodiments, is disposed downstream of the blocker plate 138. In certain embodiments, the gas distribution showerhead 130 may be disposed between the blocker plate 138 and the processing region 128. In some embodiments, the gas distribution showerhead 130 comprises an aluminum material, for example, an Al 6061-T6 material. In some embodiments, the gas distribution showerhead 130 may comprise a ceramic material, a dielectric material, quartz material, or a stainless steel material.

Figure 2A:
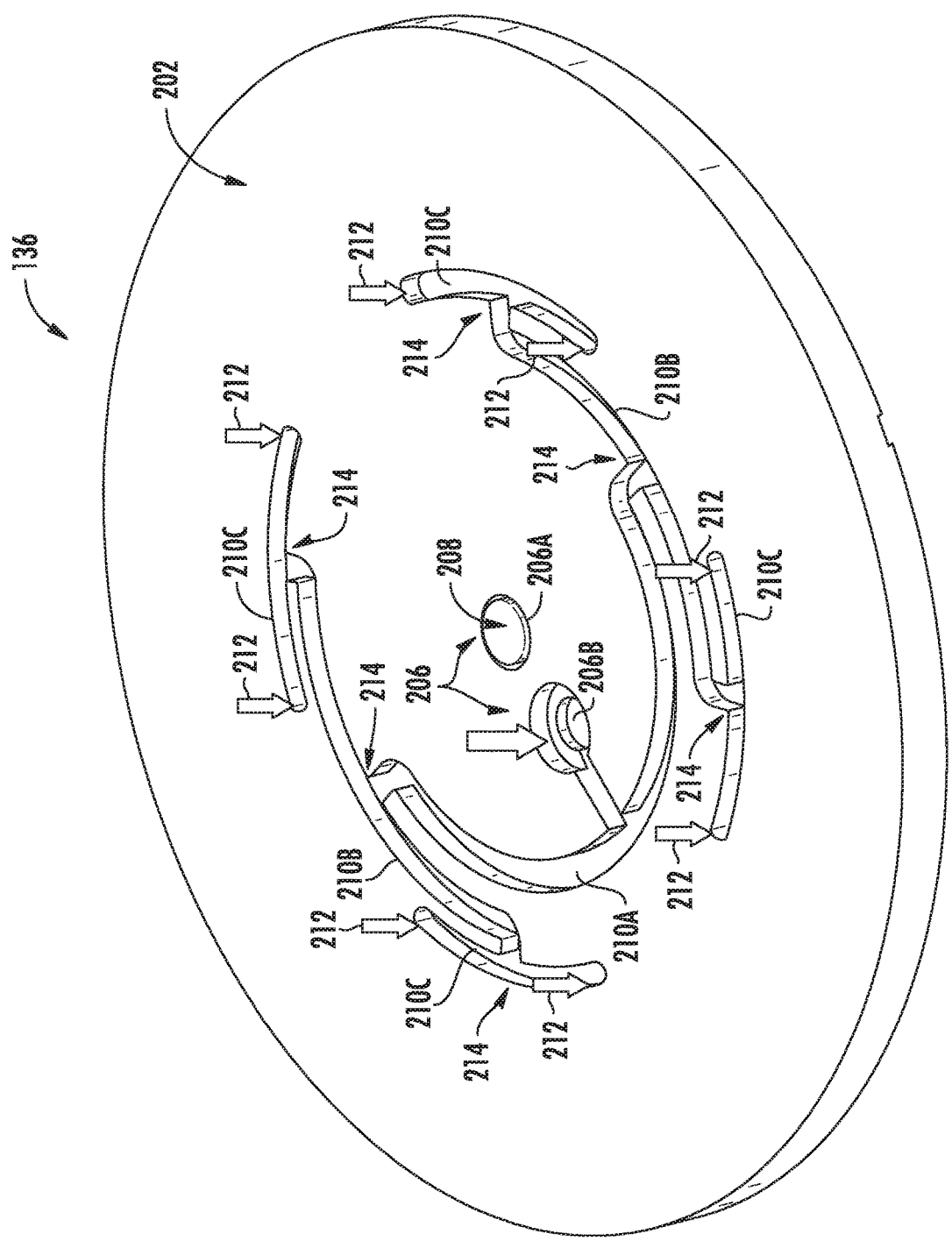
FIG. 2A is a schematic, perspective view of a top of a gas distribution plate, according to one embodiment disclosed herein.
Figure 2B:
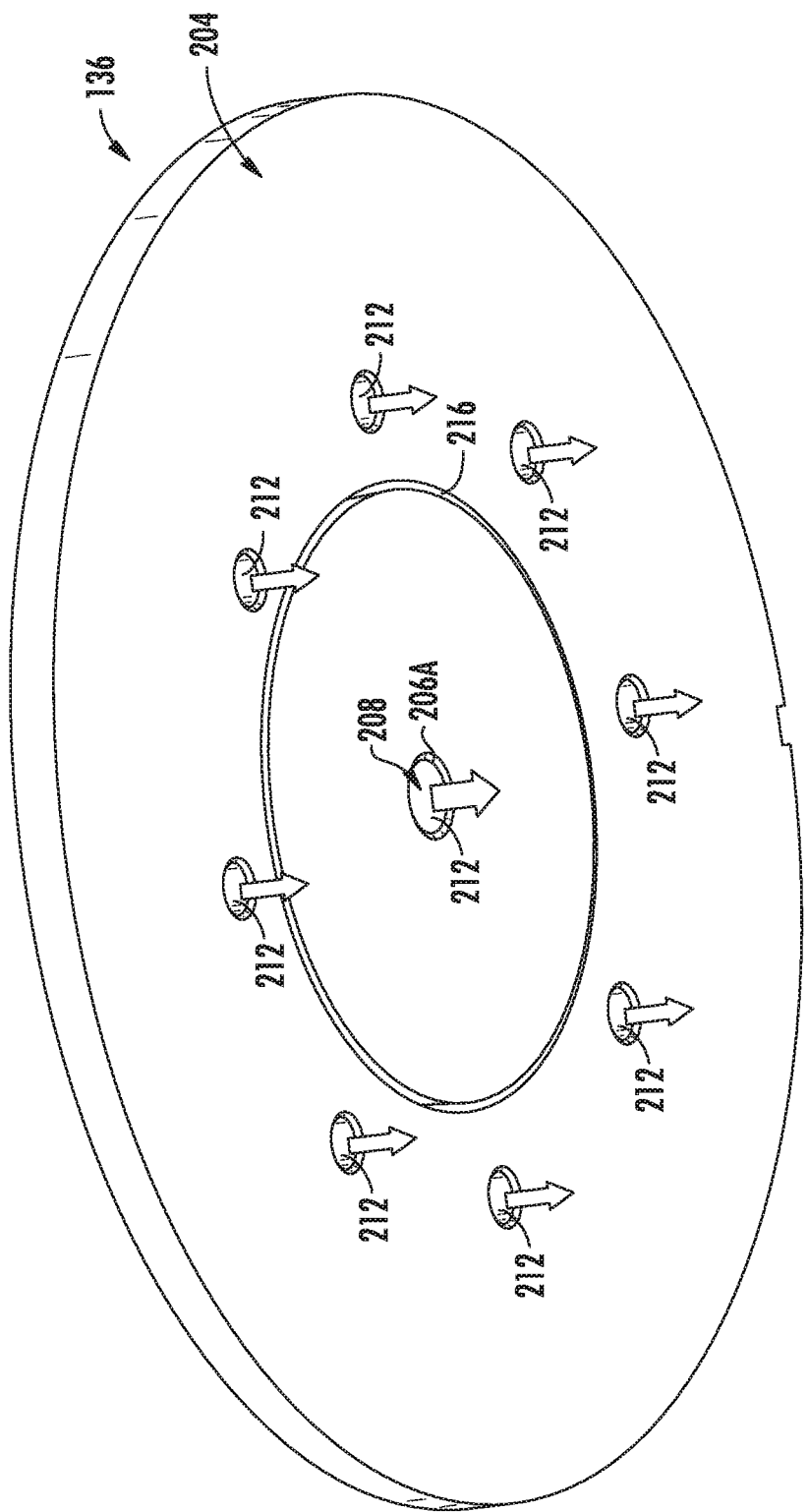
FIG. 2B is a schematic, perspective view of a bottom of the gas distribution plate of FIG. 2A, according to one embodiment disclosed herein.

FIG. 2A and FIG. 2B each schematically illustrate the gas distribution plate 136. FIG. 2A illustrates a top surface 202 of the gas distribution plate 136. As shown, the gas distribution plate 136 includes at least one gas supply inlet 206. Although a first gas supply inlet 206A and a second gas supply inlet 206B are shown, it is contemplated that any number of gas supply inlets 206 may be included in the gas distribution plate 136, for example, one gas supply inlet or four gas supply inlets. The first gas supply inlet 206A is operatively connected with a first mixing channel 140 of the mixing manifold 120 at a first location. The first location may be disposed at or adjacent the central axis 106. The first gas supply inlet 206A is further operatively connected with the blocker plate 138. The second gas supply inlet 206B is operatively connected with a second mixing channel 140 of the mixing manifold 120 at a second location. The second location may be disposed adjacent the first location. The second gas supply inlet 206B is also operatively connected with the blocker plate 138. Each gas supply inlet 206 may receive a gas via the mixing manifold 120. The first gas supply inlet 206A may distribute gas via a passage 208 to the blocker plate 138.

As shown in FIG. 2A, the gas distribution plate 136 includes a plurality of gas channels 210. The plurality of gas channels 210 form a path splitting manifold in the gas distribution plate 136. The plurality of gas channels 210 are coupled to at least one gas supply inlet. As shown in FIG. 2A, the plurality of gas channels 210 are operatively connected the second gas supply inlet 206B at a first end. At a second end of the plurality of gas channels 210, the plurality of gas channels 210 are operatively connected to a first plurality of gas holes 212. The first plurality of gas holes 212 are disposed within the plurality of gas channels 210 and extend through the gas distribution plate 136 at the second end.

The plurality of gas channels 210 are disposed radially outward from the center of the gas distribution plate 136. Furthermore, the plurality of gas channels 210 are distributed around the first gas supply inlet 206A and/or the second gas supply inlet 206B. As shown in FIG. 2A, the plurality of gas channels 210 are distributed symmetrically around the first gas supply inlet 206A and/or the second gas supply inlet 206B, however, it is contemplated that the plurality of gas channels may also be distributed non-symmetrically about the first gas supply inlet 206A and/or the second gas supply inlet 206B. As shown in the illustrated embodiment of the gas distribution plate 136 of FIG. 2A, the first gas supply inlet 206A may supply gas via an inner zone of the gas distribution plate, and the second gas supply inlet 206B may supply gas via an outer zone of the gas distribution plate. The plurality of gas channels 210 are laid out in multiple T-junctions 214 in which gas flow is approximately equally divided into opposite circumferential directions at each T-junction 214. Each T-junction 214 is cascaded so that gas flow is divided among successively shorter arcuate channels 210A, 210B, 210C in a sequence beginning with the long channels 210A and ending with the short channels 210C. The short channels 210C are terminated at the tip ends at which location is located at least one of the first plurality of gas holes 212. Each T-junction 214 is symmetrical about the gas distribution plate 136 so that the distances traveled through each of the gas channels 210 by a gas is the same. The feature assists to provide uniform gas pressure throughout all of the first plurality of gas holes 212. Furthermore, each T-junction 214 equally distributes the flow rate of the gas at said junction. The plurality of gas channels 210 provides for recursive gas flow. The plurality of gas channels 210 may be manufactured via an E-beam weld. As shown in FIG. 2A, the first plurality of gas holes 212 may include eight equally distributed gas holes 212 provide a gas outlet to the blocker plate 138. However, it is contemplated that the first plurality of gas holes 212 may include any number of gas holes.

FIG. 2B illustrates a bottom surface 204 of the gas distribution plate 136. As shown, gas exits the first plurality of gas holes 212 which extend through the bottom surface 204 of the gas distribution plate 136. The first plurality of gas holes 212 are equally spaced about an outer portion of the gas distribution plate. Upon exiting the first plurality of gas holes 212, the gas may flow into an outer zone 304 of the blocker plate 138, discussed infra. Furthermore, gas exits the first gas supply inlet 206A which also extends through the bottom surface 204 of the gas distribution plate 136. Upon exiting the first gas supply inlet 206A, the gas may flow into an inner zone 302 of the blocker plate 138, discussed infra.

Figure 3:
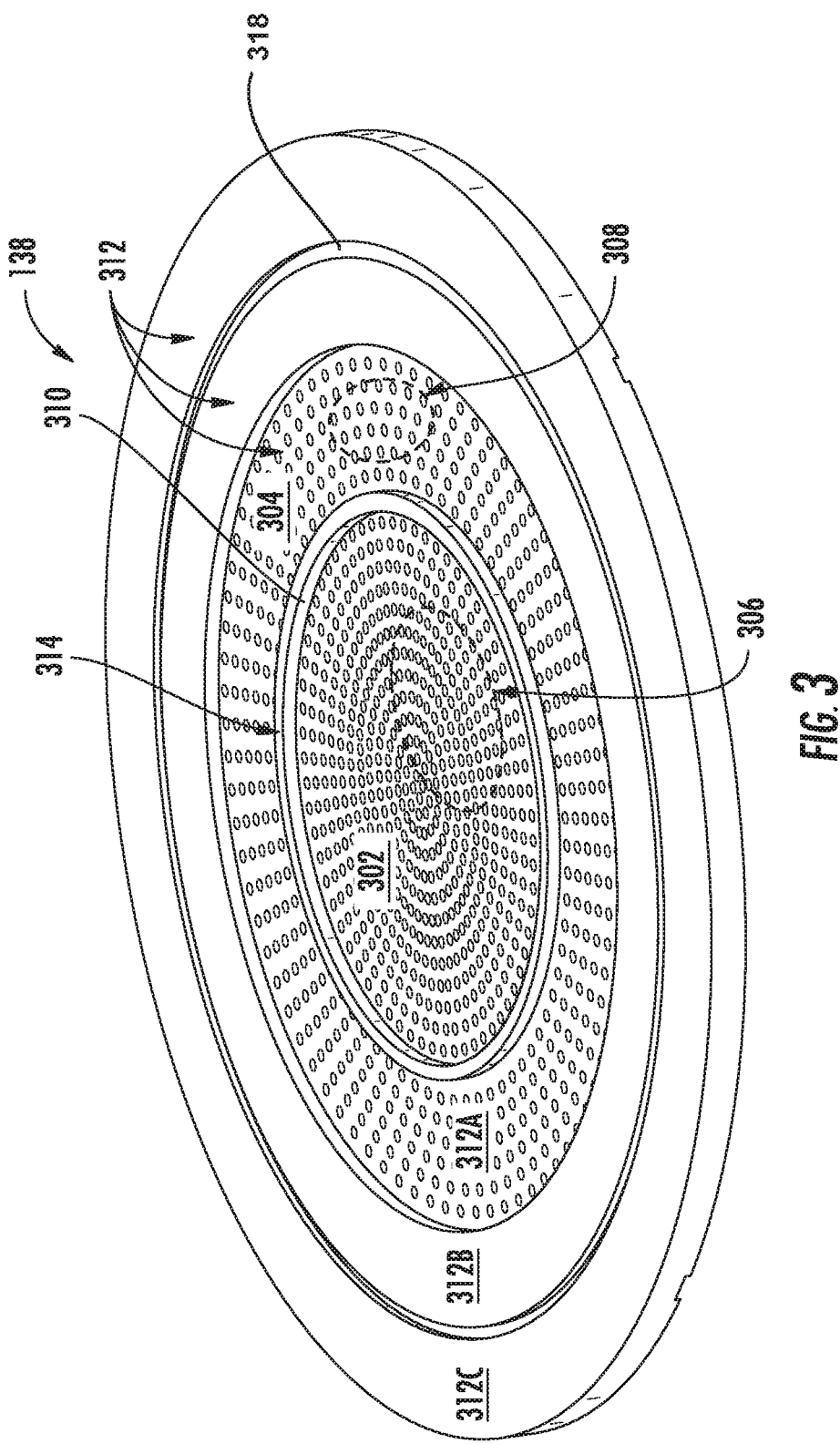
FIG. 3 is a schematic, perspective view of a top of a blocker plate, according to one embodiment disclosed herein.

FIG. 3 illustrates a top view of the blocker plate 138. It should be noted, that the corresponding bottom view of the blocker plate 138 may be, in some embodiments, substantially similar to the top view of the blocker plate 138. The blocker plate 138 is disposed between the gas distribution plate 136 and the gas distribution showerhead 130. In some embodiments, the blocker plate 138 is coupled to the gas distribution plate 136 and/or the gas distribution showerhead 130.

In some embodiments, and as shown in FIG. 3, the blocker plate 138 is a dual zone blocker plate 138. As such, the blocker plate 138 includes an inner zone 302 and an outer zone 304. The inner zone 302 may be disposed within the outer zone 304. In some embodiments, the inner zone 302 may be disposed completely within the outer zone 304. In other embodiments, the outer zone 304 may encircle the inner zone 302.

The inner zone 302 includes a second plurality of gas holes 306. In some embodiments, the second plurality of gas holes 306 may be straight-drilled gas holes. Straight-drilled gas holes may each have a longitudinal axis that is aligned with a longitudinal axis of the blocker plate 138 and/or the gas distribution showerhead 130. In other embodiments, the second plurality of gas holes 306 may be drilled at an angle. In other embodiments, the second plurality of gas holes 306 may include a mixture of straight-drilled gas holes and/or gas holes drilled at an angle. As such, gas holes drilled at an angle may have a longitudinal axis that is misaligned with a longitudinal axis of the blocker plate 138 and/or the gas distribution showerhead 130. Furthermore, in some embodiments, the second plurality of gas holes 306 may have a diameter of between about 0.01 inch and about 0.3 inch, for example, about 0.015 inch. As such, in some embodiments, the second plurality of gas holes 306 may each have a uniform width. In other embodiments, the second plurality of gas holes 306 may each have a variable width. Furthermore, each of the second plurality of gas holes 306 may be equally spaced apart, however, in some embodiments, each of the second plurality of gas holes 306 may be variably spaced apart.

The outer zone 304 includes a third plurality of gas holes 308. In some embodiments, the third plurality of gas holes 308 may be straight-drilled gas holes. Straight-drilled gas holes may each have a longitudinal axis that is aligned with a longitudinal axis of the blocker plate 138 and/or the gas distribution showerhead 130. In other embodiments, the third plurality of gas holes 308 may be drilled at an angle. In other embodiments, the third plurality of gas holes 308 may include a mixture of straight-drilled gas holes and/or gas holes drilled at an angle. As such, gas holes drilled at an angle may have a longitudinal axis that is misaligned with a longitudinal axis of the blocker plate 138. Furthermore, in some embodiments, the third plurality of gas holes 308 may have a diameter of between about 0.01 inch and about 0.3 inch, for example, about 0.015 inch. As such, in some embodiments, the third plurality of gas holes 308 may each have a uniform width. In other embodiments, the third plurality of gas holes 308 may each have a variable width. Furthermore, each of the third plurality of gas holes 308 may be equally spaced apart, however, in some embodiments, each of the third plurality of gas holes 308 may be variably spaced apart. Overall, the blocker plate 138 may include between about 600 gas holes and about 2200 gas holes.

The blocker plate 138 may include a plurality of surfaces 312, wherein each surface 312 is tiered such that each surface has a different rise from the blocker plate. In some embodiments, and as shown in FIG. 3, the blocker plate may have a first surface 312A, a second surface 312B, and a third surface 312C. The first surface 312A may have the lowest elevation, while the third surface 312C may have the highest elevation. The inner zone 302 and the outer zone 304 are disposed in the same surface. As shown, the inner zone 302 and the outer zone 304 are disposed within the first surface 312A. It is contemplated, however, that the inner zone 302 and the outer zone 304 may be disposed on different surfaces 312 fully and/or partially.

A first barrier wall 310 is disposed between the inner zone 302 and the outer zone 304 of the blocker plate 138. The first barrier wall 310 is coupled to the blocker plate 138 and extends outward from the first surface 312A of the blocker plate 138. A top surface 314 of the first barrier wall 310 may be substantially flush with a higher tiered surface of the blocker plate, for example, the second surface 312B or the third surface 312C. In some embodiments, the first barrier wall 310 may extend between about 0.125 inch and about 0.350 inch outward from the first surface 312A of the blocker plate.

A first inner O-ring 316 (see FIG. 1) may be disposed on and/or coupled to the first surface of the first barrier wall 310. Returning to FIG. 2B, a trench 216 may be formed in the bottom surface 204 of the of the gas distribution plate 136. The trench 216 in the gas distribution plate 136 may be sized to accept and/or receive the first barrier wall 310 of the blocker plate 138 and the first inner O-ring 316 such that, upon coupling the blocker plate 138 with the gas distribution plate 136, the inner zone 302 and the outer zone 304 of the blocker plate 138 are sealingly enclosed and/or coupled, on the top surface of the blocker plate. As such, the first inner O-ring 316 is disposed between the first barrier wall 310 and gas distribution plate 136. In some embodiments, the first inner O-ring 316 comprises a perfluoroelastomer material, for example, a Kalrez material.

The blocker plate 138 may include a trench 318 formed on one surface of the blocker plate 138. The trench 318 may be disposed around the outer zone 304 of the blocker plate 138 such that the trench 318 encircles the second surface 312B. The trench 318 is configured to seal blocker plate 138 to the gas distribution plate 136. The trench 318 in the blocker plate 138 may be sized to accept and/or receive the first outer O-ring 315 (see FIG. 1) such that, upon coupling the blocker plate 138 with the gas distribution plate 136, the blocker plate 138 is sealingly coupled to the gas distribution plate. As such, the first outer O-ring 315 is disposed within trench 318 and between the blocker plate 138 and gas distribution plate 136. In some embodiments, the first outer O-ring 315 comprises a perfluoroelastomer material, for example, a Kalrez material.

As noted above, the bottom side of the blocker plate 138 is substantially similar to the top side of the blocker plate 138 shown in FIG. 3. As such, the bottom side (not shown) of the blocker plate 138 also includes an inner zone and an outer zone which are each coupled to the inner zone 302 and the outer zone 304 via the second plurality of gas holes 306 and the third plurality of gas holes 308, respectively. Additionally, the inner zone on the bottom side of the blocker plate 138 may be disposed within the outer zone on the bottom side of the blocker plate. In some embodiments, the inner zone on the bottom side of the blocker plate 138 may be disposed completely within the outer zone on the bottom side of the blocker plate 138. In other embodiments, the outer zone on the bottom side of the blocker plate 138 may encircle the inner zone on the bottom side of the blocker plate 138.

The bottom side of the blocker plate 138 also may include the plurality of surfaces 312, wherein each surface 312 is tiered such that each surface has a different rise from the blocker plate 138. Additionally, the bottom side of the blocker plate 138 also includes a second barrier wall (shown in FIG. 1) which is substantially similar to the first barrier wall 310, discussed supra. The second barrier wall is disposed between the inner zone on the bottom side of the blocker plate 138 and the outer zone on the bottom side of the blocker plate 138. The second barrier wall is coupled to the blocker plate 138 and extends outward from the surface of the blocker plate 138. A top surface of the second barrier wall may be substantially flush with a higher tiered surface of the blocker plate, as discussed supra with reference to the first barrier wall 310.

Figure 4:
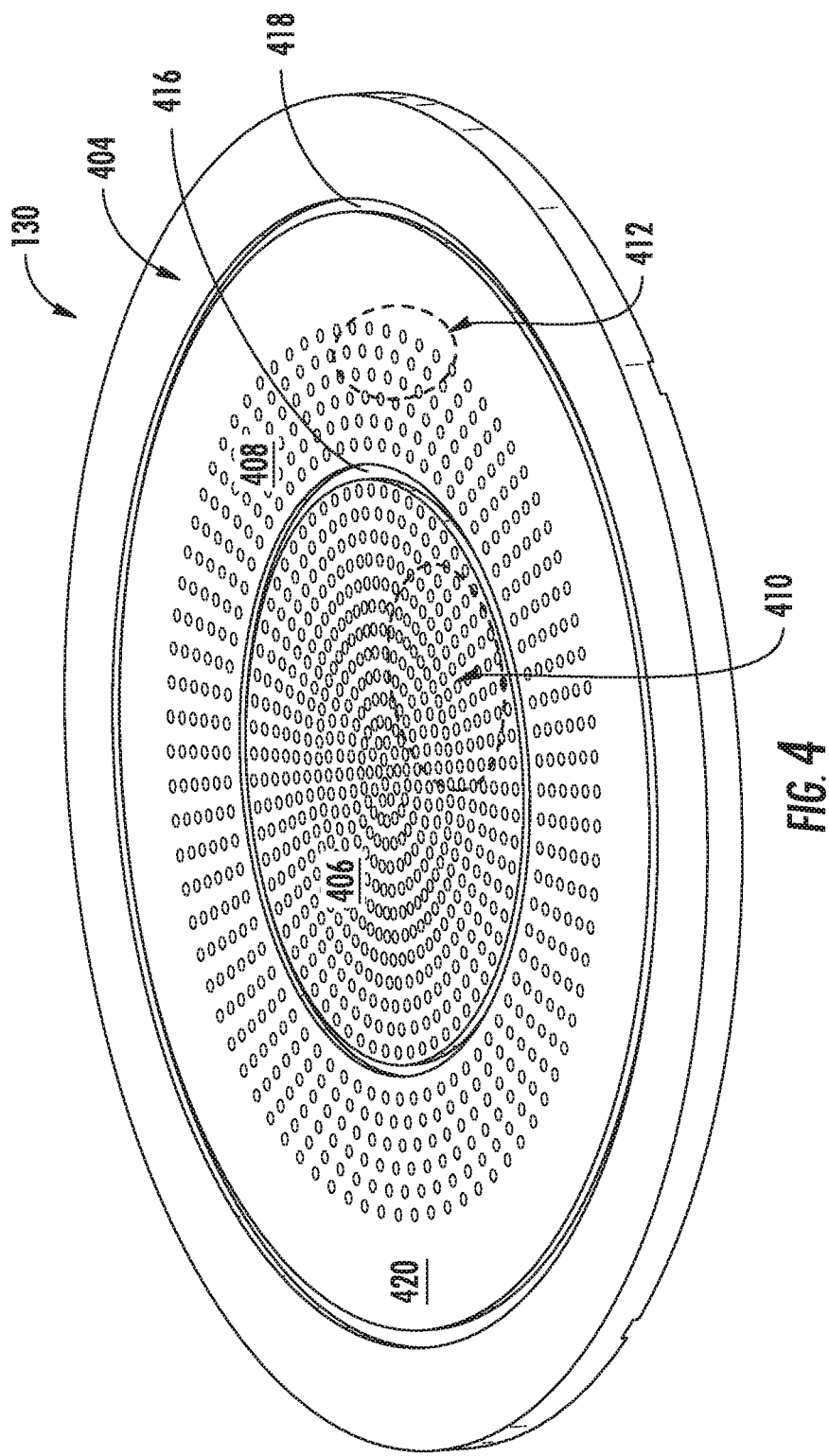
FIG. 4 is a schematic, perspective view of a top of a showerhead, according to one embodiment disclosed herein.

A second inner O-ring 316 may be disposed on and/or coupled to the first surface of the second barrier wall. As shown in FIG. 4, infra, a first trench 416 may be formed in the top surface 404 of the gas distribution showerhead 130. The first trench 416 in the gas distribution showerhead 130 may be sized to accept and/or receive the second barrier wall of the blocker plate 138 and the second inner O-ring 316 such that, upon coupling the gas distribution showerhead 130 with the blocker plate 138, the inner zone on the bottom side of the blocker plate 138 and the outer zone on the bottom side of the blocker plate 138 are sealingly enclosed and/or coupled, on the bottom surface of the blocker plate. As such, the second inner O-ring 316 is disposed between the first barrier wall 310 and the gas distribution showerhead 130. In some embodiments, the second inner O-ring 316 comprises a perfluoroelastomer material, for example, a Kalrez material.

FIG. 4 illustrates a top view of the gas distribution showerhead 130. The gas distribution showerhead 130 is disposed between the blocker plate 138 and the processing region 128. In some embodiments, the gas distribution showerhead 130 is coupled to the blocker plate 138 and/or the spacer 122.

In some embodiments, and as shown in FIG. 4, the gas distribution showerhead 130 may be a dual zone showerhead. As such, the gas distribution showerhead 130 includes an inner zone 406 and an outer zone 408. The inner zone 406 may be disposed within the outer zone 408. In some embodiments, the inner zone 406 may be disposed completely within the outer zone 408. In other embodiments, the outer zone 408 may encircle the inner zone 406.

As shown, the gas distribution showerhead 130 has an inner zone 406 and an outer zone 408 on a top surface of the gas distribution showerhead 130. The inner zone 406 of the gas distribution showerhead 130 may correspond to and/or operatively connect with the inner zone of the blocker plate 138. The inner zone 406 of the gas distribution showerhead 130 includes a fourth plurality of gas holes 410 therethrough.

In some embodiments, the fourth plurality of gas holes 410 may be straight-drilled gas holes. Straight-drilled gas holes may each have a longitudinal axis that is aligned with a longitudinal axis of the blocker plate 138 and/or the gas distribution showerhead 130. In other embodiments, the fourth plurality of gas holes 410 may be drilled at an angle. In other embodiments, the fourth plurality of gas holes 410 may include a mixture of straight-drilled gas holes and/or gas holes drilled at an angle. As such, gas holes drilled at an angle may have a longitudinal axis that is misaligned with a longitudinal axis of the gas distribution showerhead 130. Furthermore, in some embodiments, the fourth plurality of gas holes 410 may have a diameter of between about 0.01 inch and about 0.6 inch, for example, about 0.03 inch. As such, in some embodiments, the fourth plurality of gas holes 410 may each have a uniform width. In other embodiments, the fourth plurality of gas holes 410 may each have a variable width. Furthermore, each of the fourth plurality of gas holes 410 may be equally spaced apart, however, in some embodiments, each of the fourth plurality of gas holes 410 may be variably spaced apart.

The outer zone 408 of the gas distribution showerhead 130 may correspond to and/or operatively connect with outer zone of the blocker plate 138 The outer zone of the gas distribution showerhead 130 includes a fifth plurality of gas holes 412 therethrough. In some embodiments, the fifth plurality of gas holes 412 may be straight-drilled gas holes. Straight-drilled gas holes may each have a longitudinal axis that is aligned with a longitudinal axis of the blocker plate 138 and/or the gas distribution showerhead 130. In other embodiments, the fifth plurality of gas holes 412 may be drilled at an angle. In other embodiments, the fifth plurality of gas holes 412 may include a mixture of straight-drilled gas holes and/or gas holes drilled at an angle. As such, gas holes drilled at an angle may have a longitudinal axis that is misaligned with a longitudinal axis of the gas distribution showerhead 130. Furthermore, in some embodiments, the fifth plurality of gas holes 412 may have a diameter of between about 0.01 inch and about 0.6 inch, for example, about 0.03 inch. As such, in some embodiments, the fifth plurality of gas holes 412 may each have a uniform width. In other embodiments, the fifth plurality of gas holes 412 may each have a variable width. Furthermore, each of the fifth plurality of gas holes 412 may be equally spaced apart, however, in some embodiments, each of the fifth plurality of gas holes 412 may be variably spaced apart. Overall, the gas distribution showerhead 130 may include between about 600 gas holes and about 2200 gas holes.

The gas distribution showerhead 130 further includes a first trench 416 disposed within the gas distribution showerhead 130. In some embodiments, the first trench 416 is disposed between the inner zone 406 of the gas distribution showerhead 130 and the outer zone 408 of the gas distribution showerhead 130. The first trench 416 may encircle the inner zone 406. The first trench 416 is configured to accept the first barrier wall 310 of the blocker plate and the first inner O-ring 316, or in some embodiments, the first trench 416 is configured to accept the second barrier wall disposed on the bottom side of the blocker plate 138 and the second inner O-ring 316 also disposed on the bottom side of the blocker plate 138. The first trench 416 is configured to accept the first barrier wall 310 and/or the second barrier wall (not shown) such that the inner zone 406 of the gas distribution showerhead 130 is physically separated from the outer zone 408 of the gas distribution showerhead 130.

In some embodiments, the gas distribution showerhead 130 may also include a second trench 418 disposed within the gas distribution showerhead 130. The second trench 418 may be disposed around the outer zone of the gas distribution showerhead 130 such that the second trench 418 encircles the outer zone 408. The second trench 418 is configured to seal blocker plate 138 to the gas distribution showerhead 130. The second trench 418 in the gas distribution showerhead 130 may be sized to accept and/or receive the second outer O-ring 315 (see FIG. 1) such that, upon coupling the blocker plate 138 with the gas distribution showerhead 130, the blocker plate 138 is sealingly coupled to the gas distribution showerhead 130. As such, the second outer O-ring 315 is disposed within second trench 418 and between the blocker plate 138 and gas distribution showerhead 130. In some embodiments, the second outer O-ring 315 comprises a perfluoroelastomer material, for example, a Kalrez material.

In certain embodiments, the gas distribution showerhead 130 may also include a void area 420 disposed between the fifth plurality of gas holes 412 and the second trench 418. The void area 420 may encircle the outer zone 408 and/or the fifth plurality of gas holes 412. The void area 420 may include no gas holes.

Referring now to FIG. 1, FIG. 2, and FIG. 3, when the gas distribution plate 136 is coupled to and/or operatively connected to the blocker plate 138, a first plenum 150 is formed/disposed between the gas distribution plate 136 and the outer zone 304 of the blocker plate 138. Furthermore, a second plenum 152 is formed/disposed between the gas distribution plate 136 and the inner zone 302 of the blocker plate 138. Also, when the blocker plate 138 is coupled to and/or operatively connected to the gas distribution showerhead 130, the outer zone 304 of the blocker plate 138 is aligned with the outer zone 408 of the gas distribution showerhead 130, and the inner zone 302 of the blocker plate 138 is aligned with the inner zone 406 of the gas distribution showerhead 130. Additionally, a third plenum 154 is formed/disposed between the outer zone 304 of blocker plate 138 and the outer zone 408 of the gas distribution showerhead 130. Furthermore, a fourth plenum 156 is formed/disposed between the inner zone 302 of the blocker plate 138 and the inner zone 406 of the gas distribution showerhead 130. The first barrier wall 310 and/or the second barrier wall may separate the first plenum 150 from the second plenum 152 and the third plenum 154 from the fourth plenum 156. Each of the first plenum 150, the second plenum 152, the third plenum 154, and/or the fourth plenum 156 allows for sudden expansion of the gas, thus providing more uniform flow.

Referring now to FIG. 1, FIG. 3, and FIG. 4, the second plurality of gas holes 306 of the blocker plate 138 and the fourth plurality of gas holes 410 of the gas distribution showerhead 130 are patterned, such that when the blocker plate 138 is coupled to and/or operatively connected to the gas distribution showerhead 130, to avoid a co-axial flow. As such, a longitudinal axis of each of the second plurality of gas holes 306 of the blocker plate 138 are not aligned with a longitudinal axis of any of the fourth plurality of gas holes 410 of the gas distribution showerhead 130. Furthermore, the third plurality of gas holes 308 of the blocker plate 138 and the fifth plurality of gas holes 412 of the gas distribution showerhead 130 are patterned, such that when the blocker plate 138 is coupled to and/or operatively connected to the gas distribution showerhead 130, to avoid a co-axial flow. As such, a longitudinal axis of each of the third plurality of gas holes 308 of the blocker plate 138 are not aligned with a longitudinal axis of any of the fifth plurality of gas holes 412 of the gas distribution showerhead 130.

Benefits of the present disclosure include independent center to edge flow zonality, independent HF/NH$_3$ delivery, HF/NH$_3$ mixing on the lid via the mixing manifold, and recursive distribution in the gas distribution plate. Additionally, improved uniform distribution of the processing gases into the semiconductor processing chamber are realized. Furthermore, embodiments of the present disclosure are retrofitable to current, existing apparatus. Moreover, parts made of Aluminum 6061-T6 with electroless nickel plating provide for improved corrosion resistance.

Additional benefits include the ability to change and/or alter the flow rate in the processing chamber to allow for improved uniformity on the substrate. For example, different flow rates may be had between the inner zones and the outer zones of the gas distribution assembly.

To summarize, the embodiments disclosed herein relate to a gas distribution assembly for providing improved uniform distribution of processing gases into a semiconductor processing chamber. The gas distribution assembly includes a gas distribution plate, a blocker plate, and a dual zone showerhead. The gas distribution assembly provides for independent center to edge flow zonality, independent two precursor delivery, two precursor mixing via a mixing manifold, and recursive mass flow distribution in the gas distribution plate.

While the foregoing is directed to embodiments of the present disclosure, other and further embodiments of the disclosure may be devised without departing from the basic scope thereof, and the scope thereof is determined by the claims that follow.

What is claimed is:
1. A processing chamber comprising:
  a chamber body at least partially defining a processing volume within the chamber body;
  a substrate support disposed in the processing volume and coupled with the chamber body;
  an inlet adapter;
  a gas distribution assembly comprising:
    a mixing manifold having a top side and a bottom side, the mixing manifold defining a plurality of mixing channels passing from the top side to the bottom side, wherein one of the mixing channels of the plurality of mixing channels comprises:
      a choke portion; and
      a first portion and a second portion, wherein a diameter of the choke portion is disposed between the first portion and the second portion, and the diameter is less than any diameter of the first portion or the second portion;
a blocker plate disposed downstream of the mixing channels, comprising:
an inner zone defining a first plurality of gas holes;
an outer zone defining a second plurality of gas holes; and
a first barrier wall separating the inner zone from the outer zone;
a dual zone showerhead coupled with the blocker plate comprising:
an inner zone defining a third plurality of gas holes;
an outer zone defining a fourth plurality of gas holes; and
a trench disposed between the inner zone and the outer zone, wherein the first barrier wall is disposed within a portion of the trench, which is sized to receive the first barrier wall, such that a portion of the first barrier wall extends within the trench and the inner zone of the dual zone showerhead is physically separated from the outer zone of the dual zone showerhead; and
wherein the first plurality of gas holes and the third plurality of gas holes are patterned to avoid a co-axial flow, and wherein the second plurality of gas holes and the fourth plurality of gas holes are patterned to avoid a co-axial flow.

2. The processing chamber of claim 1, wherein the inner zone of the dual zone showerhead is aligned with the inner zone of the blocker plate.

3. The processing chamber of claim 1, wherein the outer zone of the dual zone showerhead is aligned with the outer zone of the blocker plate.

4. The processing chamber of claim 1, further comprising a gas distribution plate having a first gas supply inlet and a second gas supply inlet and a plurality of gas channels, the gas distribution plate coupled between the mixing manifold and the blocker plate, wherein the first gas supply inlet is coupled to one of the plurality of mixing channels and the second gas supply inlet is coupled to another one of the plurality of mixing channels, and wherein at least one of the plurality of gas channels includes a T-junction at which a gas flow is configured to be divided and flow in substantially opposing directions before entering the outer zone.

5. The processing chamber of claim 4, further comprising:
a first plenum disposed between the gas distribution plate and the outer zone of the blocker plate; and
a second plenum disposed between the gas distribution plate and the inner zone of the blocker plate.

6. The processing chamber of claim 5, further comprising:
a third plenum disposed between the dual zone showerhead and the outer zone of the blocker plate; and
a fourth plenum disposed between the dual zone showerhead and the inner zone of the blocker plate.

7. The processing chamber of claim 4, further comprising:
a first O-ring disposed between the first barrier wall and the gas distribution plate; and
a second O-ring disposed between the first barrier wall and the dual zone showerhead.

8. The processing chamber of claim 7, wherein the first O-ring and the second O-ring comprise a perfluoroelastomer material.

9. The processing chamber of claim 4, wherein the gas distribution plate, the blocker plate, or the dual zone showerhead comprise an aluminum material, a ceramic material, a dielectric material, quartz material, or a stainless steel material.

10. The processing chamber of claim 9, wherein the aluminum material is a 6061-T6 aluminum material.

11. The processing chamber of claim 4, wherein the gas distribution plate defines a fifth plurality of gas holes, and wherein the fifth plurality of gas holes includes at least eight gas holes.

12. The processing chamber of claim 1, wherein the first plurality of gas holes, the second plurality of gas holes, the third plurality of gas holes, and the fourth plurality of gas holes each have a longitudinal axis that is aligned with a longitudinal axis of the dual zone showerhead.

13. The processing chamber of claim 1, wherein the first plurality of gas holes, the second plurality of gas holes, the third plurality of gas holes, and the fourth plurality of gas holes, respectively, each have a uniform width.

14. The processing chamber of claim 1, wherein the first plurality of gas holes, the second plurality of gas holes, the third plurality of gas holes, and the fourth plurality of gas holes each have a longitudinal axis that is misaligned with a longitudinal axis of the dual zone showerhead.

15. The processing chamber of claim 1, wherein the first plurality of gas holes, the second plurality of gas holes, the third plurality of gas holes, and the fourth plurality of gas holes, respectively, each have a variable width.

16. A processing chamber comprising:
a chamber body defining a processing volume within the chamber body;
a gas distribution plate disposed within the chamber body, comprising:
at least one gas supply inlet; and
a first plurality of gas holes defined through the gas distribution plate;
a blocker plate coupled to the gas distribution plate, comprising:
an inner zone comprising a second plurality of gas holes;
an outer zone comprising a third plurality of gas holes; and
a first barrier wall separating the inner zone from the outer zone;
a dual zone showerhead coupled to the blocker plate, comprising:
an inner zone comprising a fourth plurality of gas holes;
an outer zone comprising a fifth plurality of gas holes; and
a trench disposed between the inner zone and the outer zone, wherein the first barrier wall is disposed within a portion of the trench, which is sized to receive the first barrier wall, such that a portion of the first barrier wall extends within the trench and the inner zone of the dual zone showerhead is physically separated from the outer zone of the dual zone showerhead; and
a mixing manifold having a top side and bottom side, the mixing manifold operatively coupled to the gas distribution plate, comprising:
a plurality of mixing channels passing from the top side to the bottom side, wherein one of the mixing channels of the plurality of mixing channels comprises a choke portion, a first portion and a second portion, and wherein a diameter of the choke portion disposed between the first portion and the second portion is less than any diameter of the first portion or the second portion, and wherein the blocker plate is disposed downstream of the mixing channels.

17. The processing chamber of claim 16, wherein the second plurality of gas holes and the fourth plurality of gas holes are patterned to avoid a co-axial flow, and wherein the third plurality of gas holes and the fifth plurality of gas holes are patterned to avoid a co-axial flow.

18. The processing chamber of claim 16, further comprising:
    a first plenum disposed between the gas distribution plate and the outer zone of the blocker plate; and
    a second plenum disposed between the gas distribution plate and the inner zone of the blocker plate.

19. The processing chamber of claim 16, further comprising:
    a third plenum disposed between the dual zone showerhead and the outer zone of the blocker plate; and
    a fourth plenum disposed between the dual zone showerhead and the inner zone of the blocker plate.

20. A processing chamber, comprising:
    a chamber body defining a processing volume within the chamber body;
    a substrate support disposed in the processing volume and coupled to the chamber body;
    a gas supply source coupled to the chamber body;
    a gas distribution assembly disposed in the chamber body, comprising:
    a gas distribution plate, comprising:
      at least one gas supply inlet;
      a first plurality of gas holes disposed through the gas distribution plate;
    a blocker plate coupled to the gas distribution plate, comprising:
      an inner zone comprising a second plurality of gas holes;
      an outer zone comprising a third plurality of gas holes; and
      a first barrier wall separating the inner zone from the outer zone;
    a dual zone showerhead coupled to the blocker plate, comprising:
      an inner zone comprising a fourth plurality of gas holes;
      an outer zone comprising a fifth plurality of gas holes; and
      a trench disposed between the inner zone and the outer zone, wherein the first barrier wall is disposed within a portion of the trench, which is sized to receive the first barrier wall, such that a portion of the first barrier wall extends within the trench and the inner zone of the dual zone showerhead is physically separated from the outer zone of the dual zone showerhead; and
    a mixing manifold having a top side and bottom side, the mixing manifold operatively coupled to the gas distribution plate, comprising:
      a plurality of mixing channels passing from the top side to the bottom side, wherein on of the mixing channels of the plurality of mixing channels comprises a choke portion, a first portion and a second portion, and wherein a diameter of a choke portion disposed between the first portion and the second portion is less than any diameter of the first portion or the second portion, and wherein the gas distribution plate is disposed downstream of the mixing channels.

* * * * *